United States Patent
Ahn et al.

(10) Patent No.: US 9,385,330 B2
(45) Date of Patent: Jul. 5, 2016

(54) SUBSTRATE FOR ORGANIC ELECTRONIC DEVICE, ORGANIC ELECTRONIC SYSTEM AND LIGHTING EACH WITH PARTICLE-CONTAINING LAYER HAVING LIGHT-SCATTERING PARTICLES AND SECOND PARTICLES DIFFERENT FROM THE LIGHT-SCATTERING PARTICLES

(71) Applicant: LG Chem, Ltd., Seoul (KR)

(72) Inventors: Yong Sik Ahn, Daejeon (KR); Se Hwan Son, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/601,921

(22) Filed: Jan. 21, 2015

(65) Prior Publication Data

US 2015/0129859 A1    May 14, 2015

Related U.S. Application Data

(63) Continuation of application No. PCT/KR2013/006908, filed on Jul. 31, 2013.

(30) Foreign Application Priority Data

Jul. 31, 2012 (KR) .................. 10-2012-0084210
Jul. 31, 2013 (KR) .................. 10-2013-0091009

(51) Int. Cl.
  *H01L 51/00* (2006.01)
  *H01L 51/52* (2006.01)

(52) U.S. Cl.
  CPC ........ *H01L 51/0096* (2013.01); *H01L 51/5268* (2013.01); *Y02E 10/549* (2013.01); *Y10T 428/25* (2015.01)

(58) Field of Classification Search
  None
  See application file for complete search history.

(56) References Cited

U.S. PATENT DOCUMENTS

| | | | | |
|---|---|---|---|---|
| 2008/0030861 | A1* | 2/2008 | Ookubo | C08J 7/047 359/601 |
| 2008/0231170 | A1* | 9/2008 | Masato | C09K 11/565 313/501 |
| 2009/0052195 | A1 | 2/2009 | Saneto et al. | |
| 2009/0202819 | A1* | 8/2009 | Asahi | G02B 1/111 428/336 |
| 2010/0225229 | A1* | 9/2010 | Hosoda | B82Y 20/00 313/504 |
| 2013/0049573 | A1* | 2/2013 | Chien | H01L 51/5268 313/503 |
| 2014/0042415 | A1* | 2/2014 | Park | H01L 51/5275 257/40 |
| 2014/0225098 | A1* | 8/2014 | Lee | G02B 5/0268 257/40 |
| 2015/0176797 | A1* | 6/2015 | Inoue | H01L 51/5268 362/311.01 |
| 2015/0177427 | A1* | 6/2015 | Morinaka | H01L 51/5268 362/355 |

FOREIGN PATENT DOCUMENTS

| | | |
|---|---|---|
| CN | 101790899 A | 7/2010 |
| CN | 101901825 A | 12/2010 |
| CN | 102257649 A | 11/2011 |
| CN | 104205400 A | 12/2014 |
| CN | 104321899 A | 1/2015 |
| CN | 104321900 A | 1/2015 |
| CN | 104508517 A | 4/2015 |

(Continued)

*Primary Examiner* — Michael Jung
(74) *Attorney, Agent, or Firm* — Dentons US LLP (57) ABSTRACT

The present application relates to a substrate for an organic electronic diode (OED), an organic electronic system, and a lighting. In the present application, the substrate capable of forming an OED or the organic electronic system can ensure performance including light extracting efficiency and reliability is provided.

10 Claims, 3 Drawing Sheets

(56) References Cited

FOREIGN PATENT DOCUMENTS

| | | |
|---|---|---|
| EP | 1548856 A2 | 6/2005 |
| EP | 2226867 A2 | 9/2010 |
| EP | 2557896 A1 | 2/2013 |
| EP | 2660891 A2 | 11/2013 |
| JP | 2006-286616 A | 10/2006 |
| JP | 2012-89313 A | 5/2012 |
| JP | 5263460 B1 | 5/2013 |
| KR | 10-2009-0019752 A | 2/2009 |
| KR | 10-2010-0063729 A | 6/2010 |
| KR | 10-1114352 B1 | 2/2012 |
| KR | 10-2012-0024510 A | 3/2012 |
| KR | 10-2012-0078508 A | 7/2012 |
| WO | 2011/126097 A1 | 10/2011 |
| WO | 2012/091415 A2 | 7/2012 |

\* cited by examiner

SUBSTRATE FOR ORGANIC ELECTRONIC DEVICE, ORGANIC ELECTRONIC SYSTEM AND LIGHTING EACH WITH PARTICLE-CONTAINING LAYER HAVING LIGHT-SCATTERING PARTICLES AND SECOND PARTICLES DIFFERENT FROM THE LIGHT-SCATTERING PARTICLES

This application is Bypass Continuation Application of PCT/KR2013/006908, filed on Jul. 31, 2013, which claims priority to and the benefit of Korean Patent Application Nos. 10-2012-0084210, filed on Jul. 31, 2012 and 10-2013-0091009, filed on Jul. 31, 2013, all of which are incorporated herein by reference in their entirety.

TECHNICAL FIELD

The present invention relates to a substrate for an organic electronic device (OED) and an OED.

BACKGROUND ART

An OED refers to a device exhibiting a variety of functions through charge exchange between an electrode layer and an organic material, and includes, for example, an organic light emitting device (OLED), an organic solar cell, an organic photoconductor (OPC), or an organic transistor.

In general, an OLED, which is a representative OED, sequentially includes a substrate, a first electrode layer, an organic layer including an emitting layer, and a second electrode layer.

In a structure called a bottom emitting device, the first electrode layer may be formed of a transparent electrode layer, and the second electrode layer may be formed of a reflective electrode layer. In addition, in a structure called a top emitting device, the first electrode layer is formed of a reflective electrode layer, and the second electrode layer is formed of a transparent electrode layer.

An electron and a hole are respectively injected by two electrode layers, and the injected electron and hole are recombined in an emitting layer, thereby generating light. The light may be emitted to the substrate in the bottom emitting device, and to the second electrode layer in the top emitting device.

In a structure of the OLED, an indium tin oxide (ITO) generally used as a transparent electrode layer, an organic layer, and a substrate usually such as a glass substrate have refractive indexes of approximately 2.0, 1.8, and 1.5, respectively. Due to the relationship of such refractive indexes, for example, light generated in the organic emitting layer in the bottom emitting device is trapped by total internal reflection at an interface between the organic layer and the first electrode layer, or in the substrate, and only a very small amount of light is emitted.

DISCLOSURE

Technical Problem

The present invention is directed to providing a substrate for an OED and an OED.

Technical Solution

Figure 1:
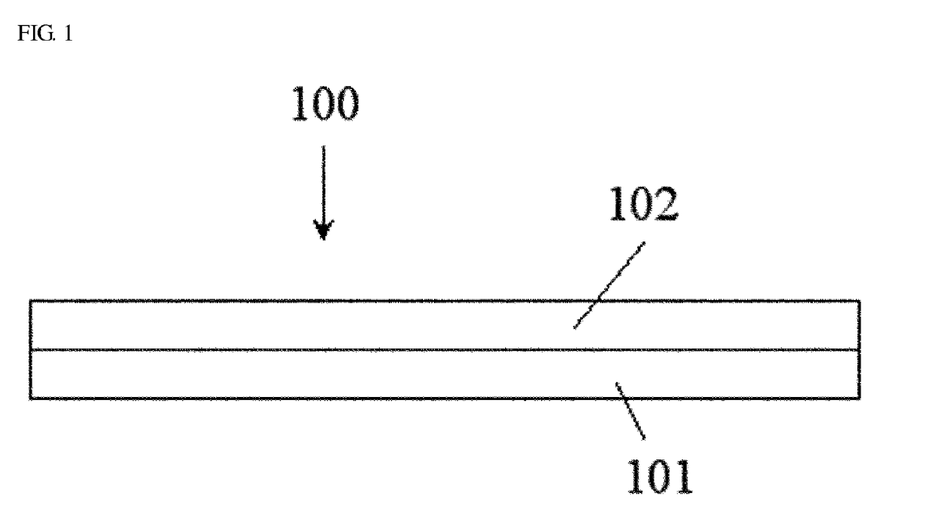
FIGS. 1 to 3 are schematic diagrams of an exemplary substrate.

One aspect of the present invention provides a substrate for an OED, which includes a base material layer, and a particle-containing layer. The particle-containing layer may be, for example, formed on the base material layer. FIG. 1 shows an exemplary substrate (100) including a base material layer (101) and a particle-containing layer (102) formed thereon.

The base material layer may be formed of a suitable material without particular limitation. For example, when a bottom emitting OLED is manufactured using a substrate, a transparent base material layer, for example, a base material layer having a transmittance with respect to light in a visible region of 50% or more. As the transparent base material layer, a glass base material layer or a transparent polymer base material layer may be used. As the glass base material layer, a base material layer formed of soda lime glass, barium/strontium-containing glass, lead glass, aluminosilicate glass, borosilicate glass, barium borosilicate glass, or quartz may be used, and as the polymer base material layer, a base material layer formed of polycarbonate (PC), an acryl resin, poly(ethylene terephthalate) (PET), poly(ether sulfide) (PES), or polysulfone (PS) may be used, but the present invention is not limited thereto. In addition, as needed, the base material layer may be a TFT substrate including a drive TFT.

For example, when the top emitting device is formed using a substrate, the base material layer may not be necessarily a transparent base material layer, and as needed, a reflective base material layer having a reflective layer formed of aluminum on a surface thereof may be used.

The particle-containing layer formed on the base material layer may include, for example, first particles, and second particles having a different refractive index and/or size from the first particles. For example, the first and second particles may all have different refractive indexes and sizes. The particle-containing layer may further include a binder maintaining the first and second particles.

As the binder of the particle-containing layer, a known material may be used without particular limitation. As the binder, for example, various organic binders, inorganic binders, or organic/inorganic binders known in the art may be used. The upper limit of the refractive index of the binder may be selected within a range satisfying a refractive index of the particle-containing layer described above in consideration of the refractive indexes of particles blended together. In consideration of a lifespan of the device and excellent resistance to a high temperature process, a photo process, or an etching process, which is performed in a manufacturing process, an inorganic or organic/inorganic binder having excellent thermal resistance and chemical resistance may be used, but an organic binder may also be used as needed. As the binder, for example, polyimide, a caldo resin having a fluorine ring, urethane, an epoxide, a polyester, or acrylate-based thermal or photocurable monomeric, oligomeric, or polymeric organic material, or an inorganic material or an organic/inorganic combination material such as silicon oxide, silicon nitride, silicon oxynitride, or polysiloxane may be used.

For example, as the binder, polysiloxane, poly(amic acid), or polyimide may be used. The polysiloxane may be formed by polycondensing, for example, a condensable silane compound or a siloxane oligomer, and such a binder may form a matrix based on binding between silicon and oxygen (Si—O). A binder matrix can be formed of polysiloxane based on only a siloxane bond (Si—O) by regulating a condensing condition during a binder forming process, or a matrix in which some condensable functional groups such as an organic group such as an alkyl group, or an alkoxy group remain can be formed.

As a poly(amic acid) or polyimide binder, for example, a binder having a refractive index with respect to light with a wavelength of 550 nm or 633 nm of about 1.5 or more, about 1.6 or more, about 1.65 or more, or about 1.7 or more may be used. The poly(amic acid) or polyimide may be prepared using, for example, a monomer to which a halogen element, other than fluorine, a sulfur element, or a phosphorus element is introduced.

As the binder, for example, a poly(amic acid) that can enhance dispersion stability of the particles since having a moiety capable of binding to a particle such as a carboxyl group may be used.

As the poly(amic acid), for example, a compound having a repeat unit of Formula 1 may be used.

[Formula 1]

In Formula 1, n is a positive number.

The repeat unit may be optionally substituted by at least one substituent. As the substituent, functional groups including a halogen element other than fluorine, an aromatic group such as a phenyl group, a benzyl group, a naphthyl group, or a thiophenyl group, a sulfur element, or a phosphorus element may be used.

The poly(amic acid) may be a homopolymer formed only of a repeat unit of Formula 1, or a copolymer including a different unit from the repeat unit of Formula 1. In case of the copolymer, the type or ratio of different repeat units may be suitably selected in the range without degrading, for example, a desired refractive index, thermal resistance, or light transmittance.

A specific example of the repeat unit of Formula 1 may be a repeat unit of Formula 2.

[Formula 2]

In Formula 2, n is a positive number.

The poly(amic acid) may have a standard polystyrene-converted weight average molecular weight measured by gel permeation chromatography (GPC) of 10,000 to 100,000, or approximately 10,000 to 50,000. In addition, the poly(amic acid) having the repeat unit of Formula 1 has a light transmittance in the visible region of 80% or more, 85% or more or 90% or more, and excellent thermal resistance.

The first particles may be, for example, scattering particles, that is, particles having light scattering properties. The term "scattering particles" may refer to, for example, particles which have a suitable refractive index and size, and are capable of scattering light incident on the particle-containing layer. For example, when the first particles have a different refractive index from the binder of the particle-containing layer and/or an overcoat layer to be described below and a suitable size, the incident light can be scattered. For example, particles having a refractive index which is different from and higher than that of the binder and/or overcoat layer may be used as the scattering particles. For example, the scattering particles may be particles having a difference in refractive index from the binder or overcoat layer of 0.4 or more or more than 0.4. The difference in the refractive index is a value obtained by subtracting a lower refractive index from a higher refractive index of the refractive indexes of the binder or overcoat layer and the scattering particles, and the difference may be, for example, 0.5 to 3.0, 0.5 to 2.5, 0.5 to 2.0, or 0.5 to 1.5. For example, the scattering particles may have a refractive index of approximately 2.1 to 3.5, or 2.2 to 3.0. In addition, as the scattering particles, for example, particles may have an average particle size of 100 nm or more, 100 nm to 20000 nm, 100 nm to 15000 nm, 100 nm to 10000 nm, 100 nm to 5000 nm, 100 nm to 1000 nm, or 100 nm to 500 nm. The scattering particles may have a spherical, oval, polygonal, or amorphous shape, but the shape thereof is not particularly limited thereto. The scattering particles may be, for example, particles including an organic material such as polystyrene or a derivative thereof, an acryl resin or a derivative thereof, a silicon resin or a derivative thereof, or a novolac resin or a derivative thereof, or an inorganic material such as silica, alumina, titanium oxide, or zirconium oxide. The scattering particles may be formed to include any one of the above-described materials, or at least two thereof. For example, as the scattering particles, hollow particles such as hollow silica or particles formed in a core/shell structure may also be used.

The ratio of the scattering particles, that is, the first particles, is not particularly limited, and may be regulated, for example, within the range in which suitable scattering properties can be ensured. For example, the scattering particles may be included in a ratio of 10 parts by weight to 2,000 parts by weight, 10 parts by weight to 1,500 parts by weight, 10 parts by weight to 1,000 parts by weight, 10 parts by weight to 800 parts by weight, 10 parts by weight to 600 parts by weight, or 10 parts by weight to 400 parts by weight with respect to 100 parts by weight of the binder of the particle-containing layer. The unit parts by weight" used herein may refer to a weight ratio between components, unless particularly defined otherwise.

The second particles may be, for example, non-scattering particles, that is, particles not scattering light incident on the particle-containing layer. For example, when the refractive index of the particles is not significantly different from that of a surrounding environment, that is, the above-described binder and/or overcoat layer, or a size of the particles is sufficiently small, the incident light is not scattered. The second particles may be particles, for example, having a lower refractive index and a smaller average particle size than the first particles. The second particles may allow the first particles to maintain a sufficient gap therebetween, thereby increasing scattering or diffusion efficiency, or serve to increase planarization efficiency of the particle-containing layer or an overcoat layer to be described below.

The second particles may have, for example, a refractive index different from but lower than that of the binder or overcoat layer. For example, the second particles may be particles having a difference in the refractive index from the binder or overcoat layer of 0.4 or less, or less than 0.4. The difference in the refractive index is a value obtained by subtracting a lower refractive index from a higher refractive index of the refractive indexes of the binder or overcoat layer and the scattering particles, and the difference may be, for example, 0 to 0.4, 0 to 0.35, 0 to 0.3, 0 to 0.25, 0 to 0.2, or 0 to 0.15. For example, the second particles may have a refractive index of 1.2 to 2.0 or 1.2 to 1.5. In addition, as the second particles, for example, particles having an average particle size of 30 nm to 500 nm, 30 nm to 400 nm, 30 nm to 300 nm, 30 nm to 250 nm, 30 nm to 200 nm, or 30 nm to 150 nm. The second particles may have a smaller average particle size than the first particles within the above range of the average particle size. The second particles may have a spherical, oval, polygonal, or amorphous shape, but the shape thereof is not particularly limited thereto. As the second particles, for example, ones having the above-range of refractive index and average particle size of the particles including organic materials such as polystyrene or a derivative thereof, an acryl resin or a derivative thereof, a silicon resin or a derivative thereof, or a novolac resin or a derivative thereof, and an inorganic material such as silica, alumina, titanium oxide, or zirconium oxide may be selected to use. The second particles may be formed to include any one of the above-described materials, or at least two of the materials. For example, as the second particles, hollow particles such as hollow silica or particles formed in a core/shell structure may also be used.

In the particle-containing layer, the ratio of the second particles is not particularly limited, and may be regulated within the range in which a suitable gap between the first particles can be ensured, or planarization can be ensured. For example, the second particles may be included in a ratio of 5 parts by weight to 8,000 parts by weight with respect to 100 parts by weight of the binder. Another lower limit of the ratio of the second particles may be, for example, 10 parts by weight, 20 parts by weight, 30 parts by weight, 40 parts by weight, 50 parts by weight, 60 parts by weight, 70 parts by weight, 80 parts by weight or 90 parts by weight. In addition, another upper limit of the ratio of the second particles may be 7,000 parts by weight, 6,000 parts by weight, 5,000 parts by weight, 4,000 parts by weight, 3,000 parts by weight, 2,000 parts by weight, 1,000 parts by weight, 900 parts by weight, 800 parts by weight, 750 parts by weight, 700 parts by weight, or 650 parts by weight.

A ratio (B/A) of a weight (B) of the second particles to a weight (A) of the first particles may be in the range of 0.05 to 10. Another lower limit of the ratio (B/A) may be, for example, 0.1, 0.5, 0.7, 1.0, or 1.2. Another upper limit of the ratio (B/A) may be, for example, 9, 8, 7, 6, 5, 4, 3.5, or 3. Within such a range, the gap between the first particles can be maintained in a suitable ratio, thereby ensuring a sufficient light scattering effect, and maintaining a planarization degree within a suitable range.

The particle-containing layer may be formed by, for example, a wet coating method using a coating solution including a binder, first particles, and second particles, or a sol-gel method.

On the particle-containing layer, an overcoat layer may be formed. The overcoat layer may have a refractive index of, for example, 1.2 to 3.5, 1.2 to 3, 1.2 to 2.5, or 1.2 to 2.2. However, the overcoat layer is not an essential component, and may be omitted as long as a suitable planarization degree and/or refractive index are ensured only with the particle-containing layer.

The overcoat layer may use, for example, various known organic, inorganic, or organic/inorganic materials. For example, the overcoat layer may be formed by selecting a material capable of having the above-described refractive index from the materials for a binder of the previously-described particle-containing layer, or using a material prepared by blending a material for the binder and high refractive particles.

The overcoat layer may be formed through, for example, a wet coating method, a sol-gel method, or a deposition method such as chemical vapor deposition (CVD) or physical vapor deposition (PVD).

The particle-containing layer or overcoat layer may further include high refractive particles as needed. For example, a refractive index of the layer may be regulated using high refractive particles. The term "high refractive particles" may refer to, for example, particles having a refractive index of 1.5 or more, 2.0 or more, 2.5 or more, 2.6 or more, or 2.7 or more. The upper limit of the refractive index of the high refractive particles may be selected in the range capable of satisfying the refractive index of the overcoat layer in consideration of the refractive index of the binder blended together. The high refractive particles may have a smaller average particle diameter than the scattering particles. The high refractive particles may have an average particle diameter of, for example, 1 nm to 100 nm, 10 nm to 90 nm, 10 nm to 80 nm, 10 nm to 70 nm, 10 nm to 60 nm, 10 nm to 50 nm, or 10 nm to 45 nm. As the high refractive particles, alumina, aluminosilicate, titanium oxide, or zirconium oxide may be used. As the high refractive particles, for example, a particle having a refractive index of 2.5 or more, such as rutile-type titanium oxide, may be used. The rutile-type titanium oxide has a higher refractive index than other particles, and thus even when a content of the high refractive particles in a material for forming the overcoat layer is relatively small, an overcoat layer having a high refractive index can be formed.

A ratio of the high refractive particles may be regulated in the range capable of ensuring a desired refractive index of each of the above-described layers without particular limitation.

The substrate may further include an electrode layer. For example, the electrode layer may be formed on the particle-containing layer, and may be in contact with the particle-containing layer or the overcoat layer. As the electrode layer, for example, a conventional hole injection or electron injection electrode layer used in manufacture of the OED such as an OLED may be formed.

The hole injection electrode layer may be formed using a material having a relatively high work function, or may be formed using a transparent material when needed. For example, the hole injection electrode layer may include a metal, alloy, or electric conductivity compound, which has a work function of approximately 4.0 eV or more, or a mixture of at least two thereof. As such a material, a metal such as gold, CuI, an oxide material such as indium tin oxide (ITO), indium zinc oxide (IZO), zinc tin oxide (ZTO), aluminum or indium-doped zinc oxide, magnesium indium oxide, nickel tungsten oxide, ZnO, $SnO_2$, or $In_2O_3$, a metal nitride such as gallium nitride, a metal serenade such as zinc serenade, or a metal sulfide such as zinc sulfide may be used. A transparent hole injection electrode layer may also be formed using a stacked structure of a metal thin film such as Au, Ag, or Cu, and a high refractive transparent material such as ZnS, $TiO_2$, or ITO.

The hole injection electrode layer may be formed by an optional means such as deposition, sputtering, chemical deposition, or electrochemical means. In addition, as needed, the formed electrode layer may be patterned through a known process using photolithography or a shadow mask. A film thickness of the hole injection electrode layer may be dependent on light transmittance or surface resistance, and may be conventionally in the range of 500 nm or from 10 nm to 200 nm.

The electron injection transparent electrode layer may be formed using, for example, a transparent material having a relatively low work function. For example, the electron injection transparent electrode layer may be formed using a suitable one of the materials used to form the hole injection electrode layer, but the present invention is not limited thereto. The electron injection electrode layer may be formed using, for example, deposition or sputtering, and when needed, may be suitably patterned. The electron injection electrode layer may be formed to a suitable thickness according to necessity.

When the electrode layer is formed, the particle-containing layer may have a smaller projection area than the electrode layer. In this case, the particle-containing layer may have a smaller projection area than the base material layer. The term "projection area" used herein refers to a projection area of a target material recognized when the substrate is observed from above or below a direction parallel to a normal line of the surface of the substrate, for example, an area of the base material layer, particle-containing layer, or electrode layer. Accordingly, for example, it is construed that even when a substantial surface area of the particle-containing layer is larger than that of the electrode layer because the particle-containing layer has an uneven surface, if an area recognized when the particle-containing layer is observed from above is smaller than that recognized when the electrode layer is observed from above, the particle-containing layer has a smaller projection area than the electrode layer.

As long as the particle-containing layer has a smaller projection area than the base material layer, and also smaller than the electrode layer, the particle-containing layer may be formed in various types. For example, the particle-containing layer (102) may be formed only in a part excluding an edge of the base material layer (101), or may partially exist on the edge of the base material layer.

Figure 2:
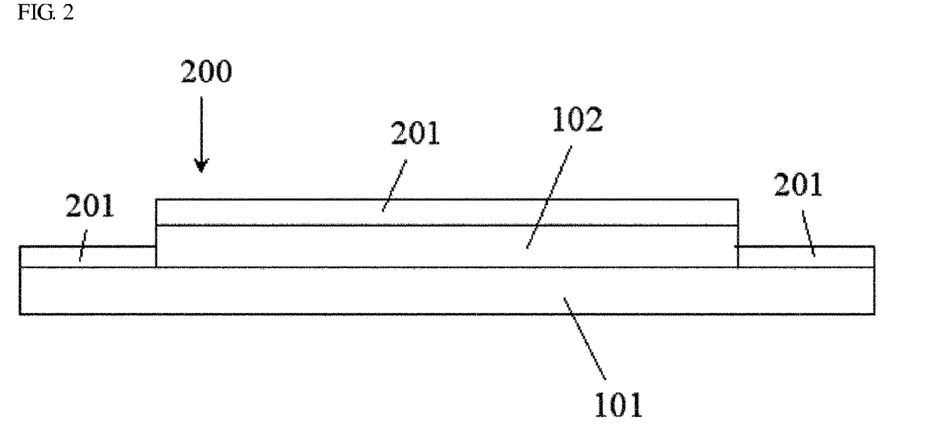
Figure 3:
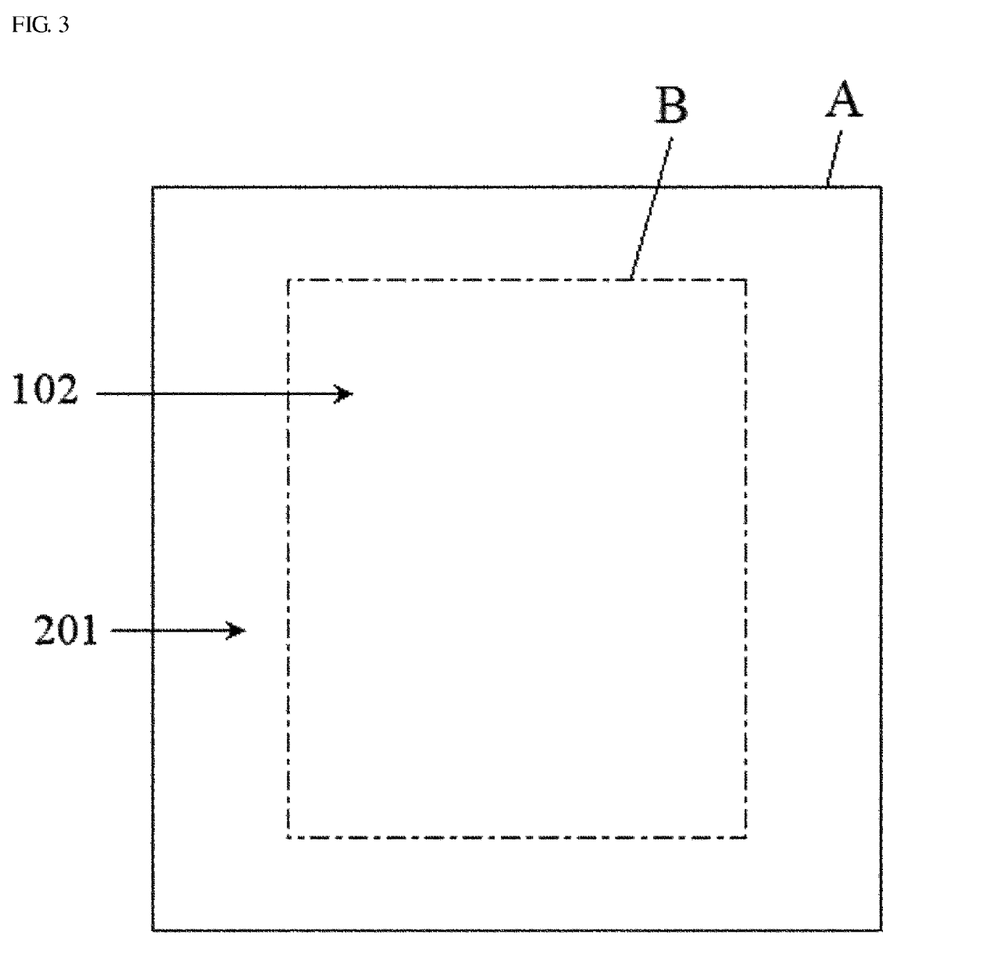

FIG. 3 is a diagram of the substrate of FIG. 2 viewed from above. As shown in FIG. 2, an area (A) of the electrode layer (201) recognized when the substrate is observed from above as shown in FIG. 2, that is, a projection area (A) of the electrode layer (201), is larger than a projection area (B) of the particle-containing layer (102) formed below the electrode layer (201). A ratio (A/B) of the projection area (A) of the electrode layer (201) to the projection area (B) of the particle-containing layer (102) or the scattering layer may be, for example, 1.04 or more, 1.06 or more, 1.08 or more, 1.1 or more, or 1.15 or more. When the projection area of the particle-containing layer is smaller than that of the electrode layer, a particle-containing layer to be described below can be formed in a structure not exposed to the outside, and thus the upper limit of the ratio (A/B) of the projection area is not particularly limited. In consideration of a general substrate manufacturing environment, the upper limit of the ratio (A/B) may be, for example, about 2.0, about 1.5, about 1.4, about 1.3 or about 1.25. In the substrate, the electrode layer may be formed on the base material layer not having a particle-containing layer. The electrode layer may be formed in contact with the base material layer, or may be formed to include an additional factor in-between the base material layer. Due to such a structure, a structure in which a particle-containing layer is not exposed to the outside in manufacture of the OED can be implemented.

For example, the electrode layer (201) as shown in FIG. 3 may be formed in a region including the region beyond all of peripheral parts of the particle-containing layer (102) when observed from above. In this case, for example, when a plurality of particle-containing layers are present on the base material layer, the electrode layer may be formed in the region including the region beyond all of the peripheral parts of at least one particle-containing layer, for example, at least a particle-containing layer on which an organic layer will be formed. The structure in which a particle-containing layer is not exposed to the outside may be formed by a method of attaching an encapsulating structure to be described below to the electrode layer not having a particle-containing layer thereunder. Because of the above-described structure, becoming of the particle-containing layer as a pathway through which moisture or oxygen penetrates can be prevented, adhering strength between the encapsulating structure or the electrode and the substrate can be ensured, and a surface hardness of a peripheral part of the device can be excellently maintained.

Another aspect of the present invention provides an organic electronic system. The exemplary organic electronic system may include a substrate for an OED, and an OED formed on the substrate, for example, a particle-containing layer of the substrate. The OED may include, for example, a first electrode layer, an organic layer, and a second electrode layer, which are sequentially formed on the particle-containing layer. In one example, the OED may be an OLED. When the OED is an OLED, the OED may have, for example, a structure in which an organic layer including at least an emitting layer is interposed between a hole injection electrode layer and an electron injection electrode layer. The hole injection electrode layer or the electron injection electrode layer may be a particle-containing layer-type electrode layer of the substrate described above.

In the OLED, the organic layer present between the electron and hole injection electrode layers may include at least one emitting layer. The organic layer may include a plurality of, for example, at least two of emitting layers. When at least two emitting layers are included, a structure in which the emitting layers are separated by an intermediate electrode or charge generating layer (CGL) having charge-generating characteristics may be formed, but the present invention is not limited thereto.

The emitting layer may be formed using, for example, various fluorescent or phosphorescent organic materials known in the art. As a material capable of being used in the emitting layer, an Alq-series material such as tris(4-methyl-8-quinolinolate)aluminum(III) (Alq3), 4-MAlq3, or Gaq3, a cyclopenadiene derivative such as C-545T ($C_{26}H_{26}N_2O_2S$), DSA-amine, TBSA, BTP, PAP-NPA, spiro-FPA, $Ph_3Si$ (PhT-DAOXD), or 1,2,3,4,5-pentaphenyl-1,3-cyclopentadiene (PPCP), 4,4'-bis(2,2'-diphenylvinyl)-1,1'-biphenyl (DPVBi), distyrylbenzene or a derivative thereof, or 4-(Dicyanomethylene)-2-tert-butyl-6-(1,1,7,7,-tetramethyljulolidyl-9-enyl)-4H-pyran (DCJTB), DDP, AAAP, NPAMLI, or Firpic, m-Firpic, N-Firpic, bon$_2$Ir(acac), (C$_6$)$_2$Ir(acac), bt$_2$Ir(acac), dp$_2$Ir(acac), bzq$_2$Ir(acac), bo$_2$Ir(acac), F$_2$Ir(bpy), F$_2$Ir(acac), op$_2$Ir(acac), ppy$_2$Ir(acac), tpy$_2$Ir(acac), or a phosphorescent material such as fac-tris[2-(4,5'-difluorophenyl)pyridine-C'2, N]iridium(III) (FIrppy) or bis(2-(2'-benzo[4,5-a]thienyl)pyridinato-N,C3')iridium(acetylactonate) (Btp$_2$Ir(acac)) may be used, but the present invention is not limited thereto. The emitting layer may include the material as a host, and also have a host-dopant system including perylene, distyrylbiphenyl, DPT, quinacridone, rubrene, BTX, ABTX, or DCJTB as a dopant.

Alternatively, the emitting layer may be formed by suitably employing kinds having emitting characteristics from electron accepting organic compounds or electron donating organic compounds.

The organic layer may be formed in various structures further including various functional layers known in the art, as long as it includes the emitting layer. As a layer which can be included in the organic layer, an electron injection layer, a hole blocking layer, an electron transport layer, a hole transport layer, and a hole injection layer may be used.

The electron injection layer or electron transport layer may be formed using, for example, an electron accepting organic compound. Here, as the electron accepting organic compound, a known optional compound can be used without particular limitation. As such an organic compound, a polycyclic compound such as p-terphenyl or quaterphenyl, or a derivative thereof, a polycyclic hydrocarbon compound such as naphthalene, tetracene, pyrene, coronene, chrysene, anthracene, diphenylanthracene, naphthacene, or phenanthrene, or a derivative thereof, or a heterocyclic compound such as phenanthroline, bathophenanthroline, phenanthridine, acridine, quinoline, quinoxaline, or phenazine or a derivative thereof. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene, or a derivative thereof, a metal chelate complex compound disclosed in Japanese Laid-Open Patent Application No. 1988-295695, Japanese Laid-Open Patent Application No. 1996-22557, Japanese Laid-Open Patent Application No. 1996-81472, Japanese Laid-Open Patent Application No. 1993-009470, or Japanese Laid-Open Patent Application No. 1993-017764, for example, a metal chelated oxanoid compound, a metal complex having at least one 8-quinolinolato or a derivative thereof such as tris(8-quinolinolato)aluminum, bis(8-quinolinolato)magnesium, bis[benzo(f)-8-quinolinolato]zinc, bis(2-methyl-8-quinolinolato)aluminum, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium as a ligand, an oxadiazole compound disclosed in Japanese Laid-Open Patent Application No. 1993-202011, Japanese Laid-Open Patent Application No. 1995-179394, Japanese Laid-Open Patent Application No. 1995-278124, or Japanese Laid-Open Patent Application No. 1995-228579, a triazine compound disclosed in Japanese Laid-Open Patent Application No. 1995-157473, a stilbene derivative or distyrylarylene derivative disclosed in Japanese Laid-Open Patent Application No. 1994-203963, a styryl derivative disclosed in Japanese Laid-Open Patent Application No. 1994-132080 or Japanese Laid-Open Patent Application No. 1994-88072, a diolefin derivative disclosed in Japanese Laid-Open Patent Application No. 1994-100857 or Japanese Laid-Open Patent Application No. 1994-207170; a fluorescent whitening agent such as a benzoxazole compound, a benzothiazole compound or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl)benzene, 1,4-bis(2-methylstyryl)-2-methylbenzene, or 1,4-bis(2-methylstyryl)-2-ethylbenzene; a distyrylpyrazine compound such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, or 2,5-bis[2-(1-pyrenyl)vinyl]pyrazine, a dimethylidine compound or a derivative thereof such as 1,4-phenylenedimethylidene, 4,4'-phenylenedimethylidene, 2,5-xylenedimethylidene, 2,6-naphthylenedimethylidene, 1,4-biphenylenedimethylidene, 1,4-para-terephenylenedimethylidene, 9,10-anthracenediyldimethylidine, 4,4'-(2,2-di-t-butylphenylvinyl)biphenyl, or 4,4'-(2,2-diphenylvinyl) biphenyl, a silanamine derivative disclosed in Japanese Laid-Open Patent Application No. 1994-49079 or Japanese Laid-Open Patent Application No. 1994-293778, a multifunctional styryl compound disclosed in Japanese Laid-Open Patent Application No. 1994-279322 or Japanese Laid-Open Patent Application No. 1994-279323, an oxadiazole derivative disclosed in Japanese Laid-Open Patent Application No. 1994-107648 or Japanese Laid-Open Patent Application No. 1994-092947, an anthracene compound disclosed in Japanese Laid-Open Patent Application No. 1994-206865, an oxynate derivative disclosed in Japanese Laid-Open Patent Application No. 1994-145146, a tetraphenylbutadiene compound disclosed in Japanese Laid-Open Patent Application No. 1992-96990, an organic trifunctional compound disclosed in Japanese Laid-Open Patent Application No. 1991-296595, a coumarin derivative disclosed in Japanese Laid-Open Patent Application No. 1990-191694, a perylene derivative disclosed in Japanese Laid-Open Patent Application No. 1990-196885, a naphthalene derivative disclosed in Japanese Laid-Open Patent Application No. 1990-255789, a phthaloperynone derivative disclosed in Japanese Laid-Open Patent Application No. 1990-289676 or Japanese Laid-Open Patent Application No. 1990-88689, or styrylamine derivative disclosed in Japanese Laid-Open Patent Application No. 1990-250292 may also be used as an electron accepting organic compound included in a low refractive layer. In addition, here, the electron injection layer may be formed using, for example, a material such as LiF or CsF.

The hole blocking layer may be a layer capable of enhancing a lifespan and efficiency of the device by preventing approach of holes injected from the hole injection electrode to the electron injection electrode through the emitting layer, and when needed, may be formed in a suitable part between the emitting layer and the electron injection electrode using a known material in the art.

The hole injection or hole transport layer may include an electron donating organic compound. As the electron donating organic compound, N,N,N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N', N'-tetra-p-tolyl-4,4'-diaminobiphenyl, bis(4-di-p-tolylaminophenyl)phenylmethane, N,N'-diphenyl-N,N'-di(4-methoxyphenyl)-4,4'-diaminobiphenyl, N,N,N',N'- tetraphenyl-4,4'-diaminodiphenylether, 4,4'-bis(diphenylamino)quadriphenyl, 4-N,N-diphenylamino-(2-diphenylvinyl)benzene, 3-methoxy-4'-N,N-diphenylaminostilbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tolyl)amine, 4-(di-p-tolylamino)-4'-[4-(di-p-tolylamino)styryl]stilbene, N,N,N',N'-tetraphenyl-4,4'-diaminobiphenyl N-phenylcarbazole, 4,4'-bis[N-(1-naphthyl)-N-phenylamino]biphenyl, 4,4'-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4'-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-pherylenyl)-N-phenylamino]biphenyl, 4,4'-bis[N-(1-coronenyl)-N-phenylamino]biphenyl, 2,6-bis(di-p-tolylamino)naphthalene, 2,6-bis[di-(1-naphthyl)amino]naphthalene, 2,6-bis[N-(1-naphthyl)-N-(2-naphthyl)amino]naphthalene, 4,4'-bis[N,N-di(2-naphthyl)amino]terphenyl, 4,4'-bis{N-phenyl-N-[4-(1-naphthyl)phenyl]amino}biphenyl, 4,4'-bis[N-phenyl-N-(2-pyrenyl)amino]biphenyl, 2,6-bis[N,N-di-(2-naphthyl)amino]fluorine, or 4,4'-bis(N,N-di-p-tolylamino)terphenyl, or an arylamine compound such as bis(N-1-naphthyl)(N-2-naphthyl)amine may be used, but the present invention is not limited thereto.

The hole injection layer or hole transport layer may be formed by dispersing the organic compound in a polymer, or may be formed using a polymer derived from the organic compound. In addition, a π-conjugated polymer such as poly-paraphenylenevinylene and a derivative thereof, a hole transport non-conjugated polymer such as poly(N-vinylcarbazole), or an α-conjugated polymer such as polysilane may also be used.

The hole injection layer may be formed using a metal phthalocyanine such as copper phthalocyanine, a non-metal phthalocyanine, or an electrically conductive polymer such as a carbon layer or a polyaniline, or by reacting the arylamine compound as an oxidant with a Lewis acid.

For example, the OLED may be formed in a type of (1) a hole injection electrode layer/an organic emitting layer/an electron injection electrode layer; (2) a hole injection electrode layer/a hole injection layer/an organic emitting layer/an electron injection electrode layer; (3) a hole injection electrode layer/an organic emitting layer/an electron injection layer/an electron injection electrode layer; (4) a hole injection electrode layer/a hole injection layer/an organic emitting layer/an electron injection layer/an electron injection electrode layer; (5) a hole injection electrode layer/an organic semiconductor layer/an organic emitting layer/an electron injection electrode layer; (6) a hole injection electrode layer/an organic semiconductor layer/an electron barrier layer/an organic emitting layer/an electron injection electrode layer; (7) a hole injection electrode layer/an organic semiconductor layer/an organic emitting layer/an adhesion-improving layer/an electron injection electrode layer; (8) a hole injection electrode layer/a hole injection layer/a hole transport layer/an organic emitting layer/an electron injection layer/an electron injection electrode layer; (9) a hole injection electrode layer/an insulating layer/an organic emitting layer/an insulating layer/an electron injection electrode layer; (10) a hole injection electrode layer/an inorganic semiconductor layer/an insulating layer/an organic emitting layer/an insulating layer/ an electron injection electrode layer; (11) a hole injection electrode layer/an organic semiconductor layer/an insulating layer/an organic emitting layer/an insulating layer/an electron injection electrode layer; (12) a hole injection electrode layer/an insulating layer/a hole injection layer/a hole transport layer/an organic emitting layer/an insulating layer/an electron injection electrode layer; or (13) a hole injection electrode layer/an insulating layer/a hole injection layer/a hole transport layer/an organic emitting layer/an electron injection layer/an electron injection electrode layer, which are sequentially formed from the particle-containing layer of the substrate, and in some cases, the OLED may have an organic layer having a structure in which at least two emitting layers are divided by an inter-electrode layer having a charge generating characteristic or charge generating layer (CGL) between a hole injection electrode layer and an electron injection electrode layer, but the present invention is not limited thereto.

Various materials for forming a hole or electron injection electrode layer and an organic layer, for example, an emitting layer, an electron injection or transport layer, or a hole injection or transport layer and methods of forming the same are known in the art, and all of the above-described methods may be applied to manufacture the organic emitting system.

The organic electronic system may further include an encapsulating structure. The encapsulating structure may be a protective structure for preventing inflow of an external material such as moisture or oxygen to the organic layer of the organic electronic system. The encapsulating structure may be, for example, a can such as a glass can or metal can, or a film covering an entire surface of the organic layer.

Figure 4:
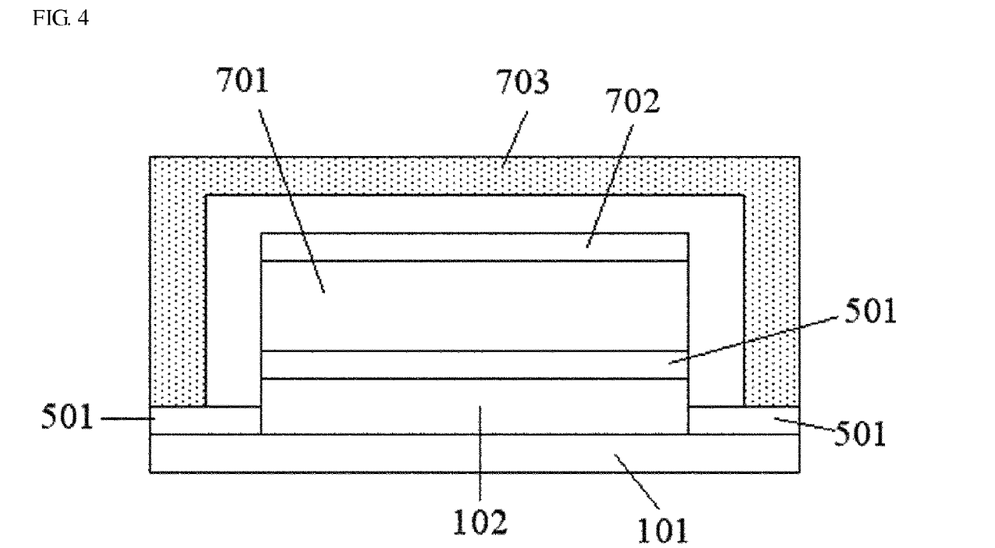
FIGS. 4 and 5 are diagrams of an exemplary organic electronic system.

FIG. 4 shows that an organic layer (701) and a second electrode layer (702) formed on a substrate including a base material layer (101), a particle-containing layer (102), and a first electrode layer (501), which are sequentially formed, are protected by an encapsulating structure (703) having a can structure, such as a glass can or a metal can. As shown in FIG. 4, the encapsulating structure (703) may be attached to the substrate by, for example, an adhesive. For example, the encapsulating structure (703) may be adhered to the electrode layer (501) below which the particle-containing layer (102) is not located in the substrate. For example, the encapsulating structure (703) as shown in FIG. 2 may be attached to an end of the substrate by the adhesive. In such a method, a protecting effect through the encapsulating structure may be maximized.

Figure 5:
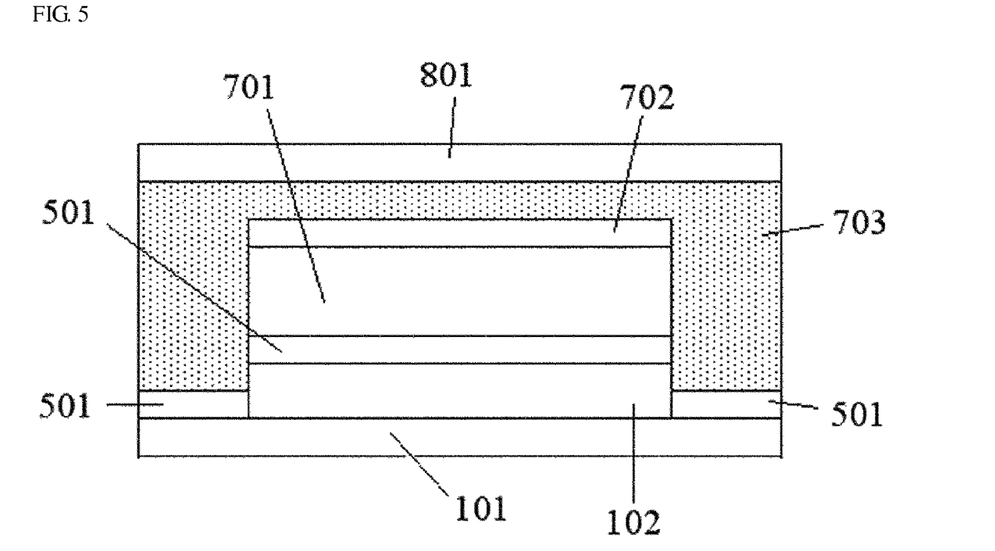

The encapsulating structure may be, for example, a film coating entire surfaces of the organic layer and the second electrode layer. FIG. 5 shows an encapsulating structure (703) formed in a film type covering entire surfaces of the organic layer (701) and the second electrode layer (702). For example, as shown in FIG. 5, the film-type encapsulating structure (703) may have a structure which coats entire surfaces of the organic layer (701) and the second electrode layer (702), and in which a substrate including a base material layer (101), a particle-containing layer (102) and an electrode layer (501) is adhered to a second substrate (801) disposed thereon. Here, the second substrate (801) may be, for example, a glass substrate, a metal substrate, a polymer film, or a barrier layer. The film-type encapsulating structure may be formed by, for example, coating a liquid material cured by heat or UV radiation such as an epoxy resin, and curing the coated material, or laminating the substrate and the upper substrate using an adhesive sheet previously manufactured in a film type using the epoxy resin.

The encapsulating structure may include a water adsorbent or a getter such as a metal oxide such as calcium oxide or beryllium oxide, a metal halide such as calcium chloride, or phosphorus pentoxide as needed. For example, the water adsorbent or getter may be included in a film-type encapsulating structure, or located at a predetermined position of a can-type encapsulating structure. The encapsulating structure may further include a barrier film or conductive film.

For example, as shown in FIG. 4 or 5, the encapsulating structure may be attached to the top of the first electrode layer (501) below which the particle-containing layer (102) is not formed. Thus, a sealing structure in which the particle-containing layer is not exposed to an external environment may be embodied. The sealing structure may refer to, for example, a state in which an entire surface of the particle-containing layer is surrounded by the base material layer, the electrode layer, and/or the encapsulating structure or by the sealing structure formed to include the base material layer, the electrode layer, and/or the encapsulating structure, thereby preventing exposure of the entire surface of the particle-containing layer to an external environment. The sealing structure may include only the base material layer, the electrode layer, and/or the encapsulating structure, or also include another component, for example, an auxiliary electrode in addition to the base material layer, the electrode layer, and the encapsulating structure as long as the particle-containing layer is not exposed to an external environment. For example, in FIG. 4 or 5, another component may be located in a part in which the base material layer (101) is in contact with the electrode layer (501) or in which the electrode layer (501) is in contact with the encapsulating structure (703), or at another position. As the other component, an organic material, inorganic material, or organic/inorganic combination material having low moisture permeability, or an insulating layer or an auxiliary electrode may be used.

Still another aspect of the present invention provides a use of the organic electronic system, for example, the organic light emitting system. The organic light emitting system may be effectively applied to a backlight of a liquid crystal display (LCD), lightings, sensors, printers, a light source of a copy machine, a light source for an automobile gauge, a signal light, a pilot lamp, a display device, a light source for a planar emitting device, a display, decorations, or other kinds of lights. In one embodiment, the present invention relates to a lighting device including the OLED. When the OLED is applied to the lighting device or for different uses, other components constituting the device and a method of constituting the device are not particularly limited, but all of optional materials or methods known in the related art may be employed as long as these are used in the OLED.

Advantageous Effects

According to the present invention, a substrate for an OED, an organic electronic system, and a lighting are provided. A substrate capable of forming an OED ensuring performance including optical extraction efficiency and reliability or an organic electronic system can be provided.

DESCRIPTION OF REFERENCE MARKS 100, 200: substrate for OED
101: base material layer
102: particle-containing layer
201: electrode layer
501: first electrode layer
701: organic layer
702: second electrode layer
703: encapsulating structure
801: second substrate

MODES OF INVENTION

Hereinafter, the present invention will be described in further detail with reference to Examples according to the present invention and Comparative Examples not according to the present invention, but the scope of the present invention is not limited to the following Examples.

Example 1

Manufacture of Substrate for OED

A coating solution capable of forming a particle-containing layer was prepared by blending titanium oxide ($TiO_2$) particles having a refractive index of about 2.7 and an average particle diameter of about 200 nm as first particles and particles having a difference in refractive index with a polysiloxane binder of about 0.1 and an average particle diameter of about 110 nm (a core-cell structure in which a core is $Al_2O_3$, and a cell is $SiO_2$) as second particles, with a condensable silane, tetramethoxy silane, as a precursor capable of forming a polysiloxane binder having a refractive index of about 1.51. In the coating solution, the first particles were mixed in a ratio of about 300 parts by weight with respect to 100 parts by weight of the tetramethoxy silane, and the second particles were mixed in a ratio of about 600 parts by weight with respect to 100 parts by weight of the tetramethoxy silane. Afterward, a particle-containing layer was formed by coating a glass substrate with the prepared coating solution, and performing condensation at about 80° C. for 2 minutes. Subsequently, an overcoat layer having a refractive index with respect to 550 nm light of about 1.8 was formed by blending titanium oxide ($TiO_2$) particles having an average particle diameter of about 20 nm and a refractive index with respect to 550 nm light of about 2.5 with a condensable silane, tetramethoxy silane, coating the particle-containing layer with a coating solution in which the resulting blend was dispersed in a mixture solvent of ethanol and methyl isobutyl ketone by a slot die, and performing condensation at 80° C. for 2 minutes. Afterward, a substrate was formed by forming a hole injection electrode layer including indium tin oxide (ITO) on the glass substrate by conventional sputtering.

Manufacture of OLED

A hole injection layer including N,N'-Di-[(1-naphthyl)-N, N'-diphenyl]-1,1'-biphenyl)-4,4'-diamine (α-NPD) and an emitting layer (4,4',4'-tris(N-carbazolyl)-triphenylamine (TCTA): Firpic, TCTA:Fir6) were sequentially formed on an electrode layer of the prepared substrate through deposition. Subsequently, an electron injection layer was formed to a thickness of about 70 nm by depositing an electron transport compound, 4,4',4'-tris(N-carbazolyl)-triphenylamine (TCTA) on the emitting layer. Subsequently, a diode was manufactured by forming an aluminum (Al) electrode as an electron injection reflective electrode on the electron injection layer by vacuum deposition. Subsequently, a device was manufactured by attaching an encapsulating structure to the diode in a glove box in an Ar gas atmosphere.

Example 2

Manufacture of Substrate of OED

A poly(amic acid) having a refractive index of about 1.7 to 1.8, synthesized by a known poly(amic acid) synthesis method was used as a binder using a compound of Formula A (3,3'-sulfonyldianiline) and a compound of Formula B (3,3',4,4'-bipheynyltetracarboxylic dianhydride). A coating solution capable of forming a particle-containing layer was prepared by blending titanium oxide (TiO$_2$) particles having a refractive index of approximately 2.6 and an average particle diameter of about 200 nm as first particles, and Al$_2$O$_3$ particles having a difference in refractive index with a poly(amic acid) binder of about 0.1, and an average particle diameter of about 80 nm as second particles with the binder. In the coating solution, the first particles were mixed in a ratio of about 50 parts by weight with respect to 100 parts by weight of the poly(amic acid), and the second particles were mixed in a ratio of about 100 parts by weight with respect to 100 parts by weight of the poly(amic acid). A particle-containing layer was formed to a thickness of about 600 nm by coating a glass substrate with the prepared coating solution and drying the glass substrate. Subsequently, a substrate for an OED was manufactured by sequentially forming an overcoat layer and a hole injection electrode layer on the particle-containing layer by the same method as described in Example 1.

[Formula A]

[Formula B]

Manufacture of OLED

A system was manufactured by the same method as described in Example 1, except that the manufactured substrate was used.

Comparative Example 1

A system was manufactured by directly forming a hole injection electrode layer, an emitting layer, an electron injection layer, and an electron injection reflective electrode by the same method as described in Example 1, except that a particle-containing layer and an overcoat layer were not formed on a glass substrate.

Results of performance evaluation with respect to Examples and Comparative Examples are shown in Table 1. In Table 1, evaluation for quantum efficiency was performed by a known method.

TABLE 1

| | Drive voltage (V) | External quantum efficiency (%) |
|---|---|---|
| Example 1 | 3.2 | 27.2 |
| Example 2 | 3.1 | 25.8 |
| Comparative Example 1 | 3.1 | 18.9 |

The invention claimed is:

1. A substrate for an organic electronic device (OED), comprising:
    a base material layer;
    a particle-containing layer which is present on the base material layer, and includes:
        (i) first light-scattering particles having an average particle diameter of 100 nm or more, and
        (ii) second particles having an average particle diameter of 30 nm to 500 nm, wherein the average particle diameter of the second particles is smaller than that of the first light-scattering particles; and
    an overcoat layer which is formed on the particle-containing layer, and has a refractive index of 1.2 to 3.5, wherein the overcoat layer includes particles having a refractive index of 1.5 or more, and an average particle diameter of 1 to 100 nm.

2. The substrate for an organic electronic device (OED) of claim 1, wherein the particle-containing layer further comprises a binder having a refractive index of 1.4 or more.

3. The substrate for an organic electronic device (OED) of claim 2, wherein the binder is polysiloxane, poly(amic acid) or polyimide.

4. The substrate for an organic electronic device (OED) of claim 2, wherein the first light-scattering particles have a difference in refractive index from the binder of more than 0.4.

5. The substrate for an organic electronic device (OED) of claim 2, wherein the first light-scattering particles are comprised in the particle-containing layer in an amount of 10 parts by weight to 2,000 parts by weight, relative to 100 parts by weight of the binder.

6. The substrate for an organic electronic device (OED) of claim 2, wherein the second particles have a difference in refractive index from the binder of 0.4 or less.

7. The substrate for an organic electronic device (OED) of claim 2, wherein the second particles are comprised in the particle-containing layer in an amount of 5 parts by weight to 8,000 parts by weight, relative to 100 parts by weight of the binder.

8. The substrate for an organic electronic device (OED) of claim 1, wherein the second particles are non-scattering particles.

9. The substrate for an organic electronic device (OED) of claim 1, wherein a ratio (B/A) of a weight (B) of the second particles to a weight (A) of the first light-scattering particles is 0.05 to 10.

10. The substrate for an organic electronic device (OED) of claim 1, further comprising an electrode layer formed on the particle-containing layer.

* * * * *